(12) United States Patent
Inoue

(10) Patent No.: US 6,191,435 B1
(45) Date of Patent: *Feb. 20, 2001

(54) SEMICONDUCTOR INTEGRATED CIRCUIT AND LIQUID CRYSTAL DISPLAY APPRATUS

(75) Inventor: Shunsuke Inoue, Yokohama (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/612,496

(22) Filed: Mar. 7, 1996

(30) Foreign Application Priority Data

Mar. 9, 1995 (JP) .................................... 7-049808
Feb. 26, 1996 (JP) .................................... 8-038051

(51) Int. Cl.$^7$ ...................................... H01L 29/04
(52) U.S. Cl. .............................. 257/72; 257/59
(58) Field of Search ...................... 257/59, 57, 72

(56) References Cited

U.S. PATENT DOCUMENTS

| | | | |
|---|---|---|---|
| 5,218,232 | 6/1993 | Yazurihara et al. | 257/754 |
| 5,349,456 * | 9/1994 | Iwanaga et al. | 359/82 |
| 5,412,240 | 5/1995 | Inoue et al. | 257/347 |
| 5,434,441 * | 7/1995 | Inoue et al. | 257/347 |
| 5,530,266 * | 6/1996 | Yonehara et al. | 257/72 |
| 5,610,533 * | 3/1997 | Arimoto et al. | 326/33 |

* cited by examiner

Primary Examiner—Olik Chaudhuri
Assistant Examiner—Douglas A. Wille
(74) Attorney, Agent, or Firm—Fitzpatrick, Cella, Harper & Scinto

(57) ABSTRACT

Transistors (43, 44, 45) of an SOI type semiconductor integrated circuit or a liquid crystal display apparatus to which the SOI semiconductor integrated circuit is applied are prevented from leaking a current. A semiconductor region (41) is formed below at least some of a plurality of transistors through an insulating region 42, and changes in threshold value of the transistors (43, 44, 45) caused by a potential applied to the semiconductor region are adjusted. At this time, the transistors (43, 44, 45) have well potentials (45) fixed to a first potential in the circuit, and the semiconductor region is fixed to a second potential. A signal $V_{SIG}$ transferred from a source (43) to a drain (44) satisfies $V_{DMIN} \leq V_{SIG} \leq V_{DMAX}$ ($V_{DMIN}$ and $V_{DMAX}$ are the minimum and maximum values of the signal $V_{SIG}$), and, depending on the conductivity types of the transistors (43, 44, 45), the signal $V_{SIG}$ is adjusted such a manner that the following conditions are satisfied:

$V_{DMIN} > V_{SS} + V_{th} + \Delta V_{th}$ (when an n-channel transistor is used)

$V_{DMAX} < V_{DD} + V_{th} + \Delta V_{th}$ (when a p-channel transistor is used).

4 Claims, 7 Drawing Sheets

SEMICONDUCTOR INTEGRATED CIRCUIT AND LIQUID CRYSTAL DISPLAY APPRATUS

BACKGROUND OF THE INVENTION

1. Field of the Invention

The present invention relates to an SOI type semiconductor integrated circuit having a plurality of transistors and to a liquid crystal display apparatus to which the SOI type semiconductor integrated circuit is applied.

2. Related Background Art

A substrate having a silicon monocrystal on an insulating substrate is called an SOI (Silicon-on-Insulator) substrate, and is used excellently not only as a substrate for a next-generation high-function and high-performance integrated circuit but also as a TFT (Thin-film Transistor) of a liquid crystal display apparatus. The SOI substrate has been developed from an amorphous SiTFT or Poly-SiTFT substrate which is popularly used at present, and is an ideal TFT substrate. A liquid crystal display apparatus using substantially monocrystalline silicon will be described below.

FIGS. 7A, 7B, and 7C show a liquid crystal display apparatus in which an image display portion and a peripheral drive portion are integrated with each other. FIG. 7A shows a TFT substrate in which the pixel transistor and drive circuit of the liquid crystal display apparatus are integrated. Referring to FIG. 7A, reference numeral 11 denotes a peripheral drive circuit portion, and reference numeral 12 denotes an image display portion. FIG. 7B is a sectional view showing the TFT substrate along a line 7B—7B in FIG. 7A. Referring to FIG. 7B, reference numeral 13 denotes a hollow portion used for making the image display portion 12 transparent. FIG. 7C shows a liquid crystal display apparatus which is completed by using the substrate shown in FIG. 7B as a TFT substrate 1. Referring to FIG. 7C, reference numeral 2 denotes a liquid crystal; 3, a counter substrate 3 opposing the TFT substrate; 4, a spacer for holding a cell gap between the TFT substrate 1 and the counter substrate 3; 5, a potting material for controlling the gap width of the liquid crystal (this potting material 5 is not necessarily used); and 6, a glass for sealing the potting material. In the hollow portion, the silicon substrate is removed, so that the insulating layer of the SOI substrate becomes thin film (like a membrane) to be optically transparent.

The details of the TFT substrate 1 are shown in FIG. 8. The pixel portion 13 corresponding to the display portion of the liquid crystal display apparatus is hollowed out to remove substrate silicon from the pixel portion 13. The peripheral drive circuit portion 11 for driving the pixel portion still has a substrate silicon 41 for keeping the mechanical strength of the peripheral drive circuit portion 11 and shielding the peripheral drive circuit portion 11 from light. For example, assume that a transistor in the pixel portion is a p-type TFT. In this case, the TFT for supplying desired charges to a pixel is formed on an underlying insulating film 42, and is constituted by a $p^+$-type source 43, a $p^+$-type drain 44, an n well 45, a gate insulating film 46, and a gate electrode 47. A pixel transparent electrode 48 for applying a voltage to the liquid crystal is connected to the $p^+$-type drain 44. In order to keep charges which are temporarily written for a long time, it is effective to add a capacity component to the pixel transparent electrode 48. In this case, for example, a pixel common electrode 49 is formed below the pixel transparent electrode 48 through an insulating layer to form a holding capacity therebetween. A transistor in the drive circuit portion is formed on the substrate silicon 41 through the underlying insulating film 42. This transistor, like the TFT of the pixel portion, is also constituted by the $p^+$-type source 43, the $p^+$-type drain 44, the n well 45, the gate insulating film 46, and the gate electrode 47. Metal electrodes 50 are connected to the terminals of each transistor to form a circuit. The elements are insulated from each other by the first insulating interlayer 51, and the metal electrodes are insulated from each other by a second insulating interlayer 52. A third insulating interlayer 53 serving as a protective film is formed on the surface of the TFT substrate 1.

FIG. 9 is a circuit diagram illustrating part of the drive circuit portion and part of the pixel portion. In this case, an example wherein a video signal is sampled and held and then written is described. A video signal from the video signal line 81 is sampled by a sampling transistor 82 and then stored in a sampling capacitor 83. The stored signal is transferred to a signal line 85 of the pixel portion 13 and supplied to a common source line of a pixel TFT 86 by turning on a transfer transistor 84. The transfer transistor operates in the same manner as in a case wherein a video signal is directly written by the transfer transistor without being sampled and held.

Although not shown in FIGS. 8 and 9, in the thin film transistor formed on the SOI substrate, the volume of the well region is smaller than that of a bulk transistor. Further, the crystallinity is better than that of a poly-Si thin film transistor, so that a carrier lifetime is prolonged. From these causes, a small number of carriers are disadvantageously generated near the drain during an operation of the transistor are stored in the well to excessively change the potential of the well. This change in potential makes the operation of the transistor unstable and decreases the breakdown voltage of the transistor. As a countermeasure against this, a method of forcibly fixing the potential of the well region is effectively used. The plan layout of a p-channel TFT using this countermeasure is shown in FIG. 10A. The region of the thin film silicon is surrounded by a polygon along a b→c→. . . →j→a to form a well contact 45b in a silicon region extended in the longitudinal direction of the gate. As in an ordinary bulk silicon, the potential of the n well is fixed to the maximum potential in the circuit.

Although the p-type TFT is described above, when all the conductivity types are replaced, an n-type TFT may be used like the p-type TFT. In addition, some actual circuit arrangement has both p- and n-type transistors. In order to suppress ionization near the drain, a method of forming an electric field relaxation layer having a density lower than that of the drain between the gate and the drain is effective to increase the breakdown voltage. However, the countermeasure in which only the electric field relaxation layer is arranged in a circuit such as a liquid crystal display apparatus to which a high voltage is applied is not satisfactory.

The monocrystalline silicon transistor is described above. However, when a polysilicon film is formed in the form of an insulating film, a lifetime is prolonged by improving the crystal quality of the polysilicon film. For this reason, the breakdown voltage of the high-quality polysilicon film disadvantageously decreases, and the potential of the n well must be fixed to a specific value.

As described above, when a liquid crystal display is formed by an SOI substrate or a substrate using high-quality polysilicon, a well contact must be formed in each transistor. For this reason, the following problems are posed:

(i) the transistor of the pixel portion increases in area to decrease an opening; and (ii) in the signal transfer circuit, a threshold value increases due to a substrate bias effect unique to the SOI substrate, so that it is difficult to desirably transfer a signal.

For this reason, in FIG. 8, the threshold value of the transfer transistor 84 must have a margin in a direction in which the threshold value has an absolute value larger than that of a bulk transistor, in order to prevent the threshold value of the pixel TFT 86 from being excessively close to 0 (V) even if the well potential changes. Therefore, when this circuit is used as the drive circuit of the liquid crystal display apparatus, the circuit has the following drawbacks.

(1) Since signal charges stored in the sampling capacitor are sufficiently transferred to the signal line 85, a white signal (or black signal) for making the contrast of a liquid crystal display satisfactory cannot be displayed.

(2) Since the pixel TFT easily leaks a current when the transistor is in an ON state, a voltage applied to the liquid crystal cannot be kept to be sufficiently high, and a contrast is degraded.

Therefore, it is an object of the present invention to provide an SOI type semiconductor integrated circuit including a small-size transistor having a small amount of leakage current and a liquid crystal display apparatus to which the SOI type semiconductor integrated circuit is applied.

SUMMARY OF THE INVENTION

In order to solve the above problems, the present inventor vigorously made an effort. As a result, the following invention was obtained. More specifically, according to the present invention, a semiconductor integrated circuit having a plurality of transistors on an insulating region is characterized in that a semiconductor region is formed below at least some of the plurality of transistors through the insulating region, and changes in threshold value of the transistors caused by a potential applied to the semiconductor region are adjusted. In this case, the well potential of the transistor is fixed to the first potential in the circuit, and the semiconductor region is fixed to the second potential. For this reason, a signal $V_{SIG}$ is preferably transferred from the source of the transistor to the drain thereof or from the drain to the source. In this case, the signal $V_{SIG}$ satisfies $V_{DMIN} \leq V_{SIG} \leq V_{DMAX}$ ($V_{DMIN}$ and $V_{DMAX}$ are the minimum and maximum values of the signal $V_{SIG}$), and, depending on the conductivity type of the transistor, the following conditions are satisfied:

$V_{DMIN} > V_{SS} + V_{th} + \Delta V_{th}$ (when an n-channel transistor is used)

$V_{DMAX} < V_{DD} + V_{th} + \Delta V_{th}$ (when a p-channel transistor is used)

(where $V_{th}$ is the threshold voltage of a reference transistor; $\Delta V_{th}$, a change amount of the threshold value of the transistor changed according to claim 1; $V_{SS}$, the minimum potential in the circuit, which is the second potential when the transistor whose threshold value is changed is an n-channel transistor and which is the first potential when the transistor whose threshold value is changed is a p-channel transistor; and $V_{DD}$, the maximum potential in the circuit, which is the first potential when the transistor whose threshold value is changed is an n-channel transistor and which is the second potential when the transistor whose threshold value is changed is a p-channel transistor). The value $\Delta V_{th}$ is determined depending on the first and second potentials, the thickness of the insulating region, the impurity concentration in the well region, the thickness of the well region, the material of the gate electrode, and the like.

The semiconductor integrated circuit according to the present invention can be applied to a liquid crystal display apparatus. This liquid crystal display apparatus is characterized in that a peripheral circuit and a pixel switch include the plurality of transistors of the semiconductor integrated circuit of the present invention, only the insulating region is arranged below the transistor of the pixel switch (to be referred to as a pixel transistor hereinafter), and the semiconductor region is formed below the transistor of the peripheral circuit (to be referred to as a transfer transistor hereinafter) through the insulating region. In this case, a threshold value $V_{thpixel}$ of the pixel transistor preferably satisfies the following condition:

$1.5\ (V) < |V_{thpixel}|$ and $|V_{thTR}| < |V_{thpixel}|$ (where $V_{thTR}$ is the threshold value of the transfer transistor).

DETAILED DESCRIPTION OF THE PREFERRED EMBODIMENTS

A semiconductor integrated circuit according to the present invention can be applied to not only a liquid crystal display apparatus but also a general integrated circuit.

Figure 7A:
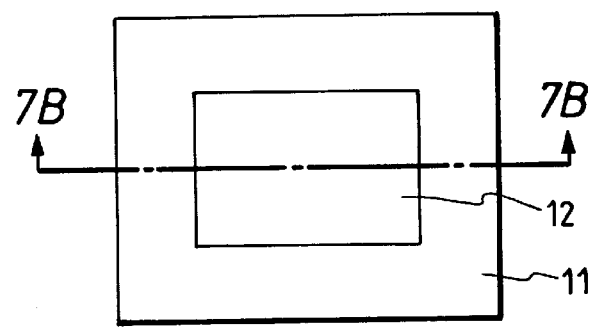
FIGS. 7A to 7C are views illustrating a peripheral-drive-circuit-integral type liquid crystal display apparatus.
Figure 7B:
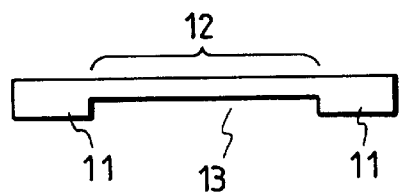
Figure 7C:
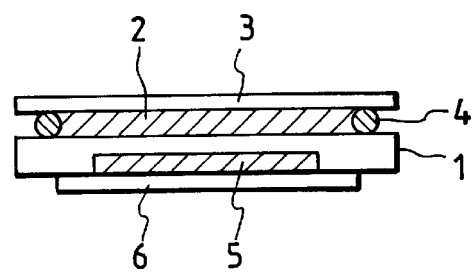
Figure 9:
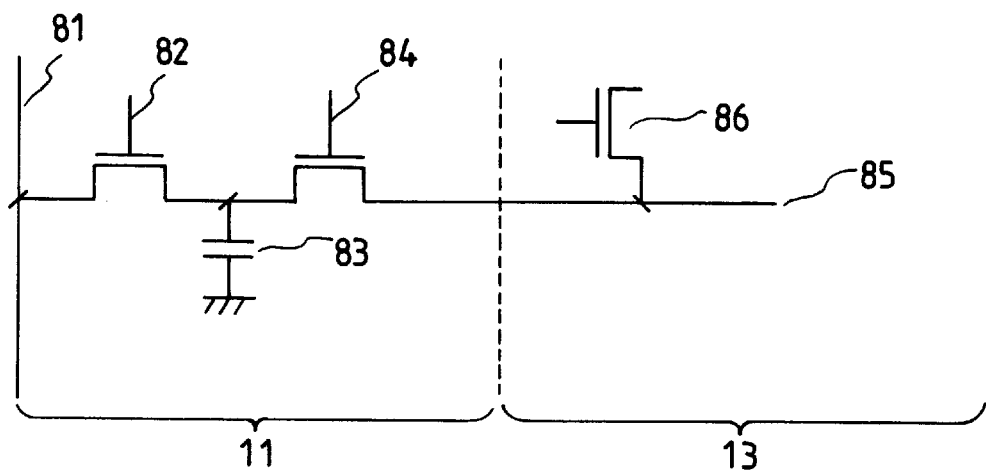
FIG. 9 is a schematic circuit diagram showing a peripheral-drive-circuit-integral type liquid crystal display apparatus.

The principle of the present invention will be described below. Conventionally, the threshold value of the transfer transistor 84 in FIG. 9 changes due to the influence of a substrate potential as described later such a manner that the effective absolute value of the threshold value increases, and the threshold value of the pixel TFT 86 changes due to a change in potential caused by a hot carrier effect such a manner that the absolute value of the threshold value decreases. This is because both the threshold values of the transfer transistor 84 and the pixel TFT 86 are set to be the same value in bulk. More specifically, since the semiconductor substrate below the image display portion 12 is hollowed out as shown in FIG. 7B, the threshold value of the pixel TFT is not set to be a desired value for the following reason.

Figure 8:
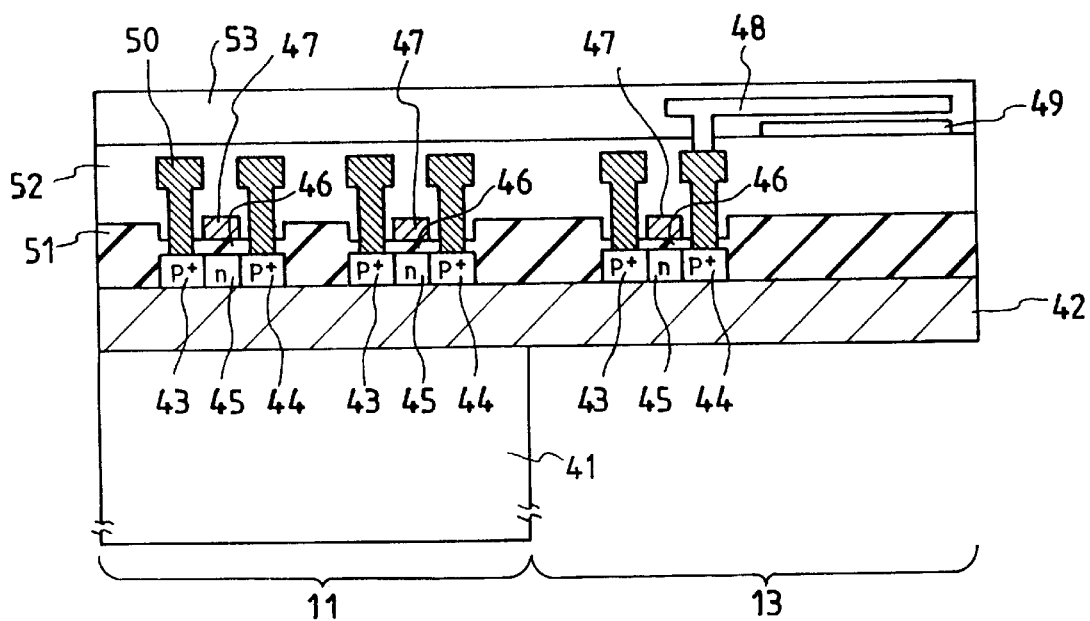
FIG. 8 is a sectional view showing a conventional liquid crystal display apparatus.
Figure 10A:
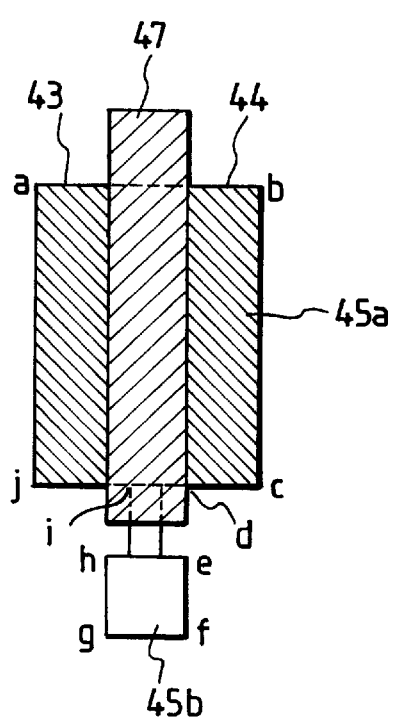
FIGS. 10A and 10B are views showing a well-potential-fixed type transistor.
Figure 10B:
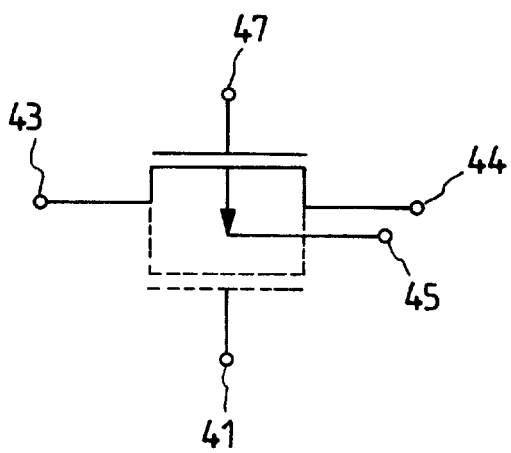

In a transfer transistor in which a semiconductor substrate is not hollowed out, as shown in FIG. 8, since the source 43 and the drain 44 are generally in contact with the underlying insulating film 42, a parasitic transistor which uses the underlying insulating film 42 and the substrate silicon 41 as a gate insulating film and a gate electrode, respectively. This manner is shown in an equivalent circuit diagram of FIG. 10B. Referring to FIG. 10B, a broken line indicates a parasitic transistor. This parasitic transistor controls the potential of the well region in the circuit. That is, when the potential of the semiconductor substrate (41) is changed, the potential of the well region (45) serving as a channel region changes.

In general, the potential of the semiconductor substrate is kept at the maximum potential ($V_{DD}$) in the circuit to prevent the parasitic transistor from being turned on (when a p-channel transistor is used). On the other hand, assume that a transistor on an SOI substrate is not used but a bulk MOS transistor is used. In this case, as well known, when the potential of the well region is biased to a potential $V_{WS}$ with respect to the source region, the threshold value $V_{th}$ of the MOS transistor changes by $\Delta V_{th}$ given by the following equation.

$$\Delta V_{th} = -\gamma(\sqrt{\phi_F + V_{WS}} - \sqrt{\phi_F}) \tag{1}$$

where $$\gamma = (\sqrt{2q\epsilon_{Si}N_w})/C_{ox}$$

--- q: quantum of electricity
$\epsilon_{Si}$: dielectric constant of Si
$N_W$: impurity concentration of well
$C_{OX}$: capacitance per unit area of gate insulating film
$\phi_F$: quasi Fermi potential of well

---

Figure 11:
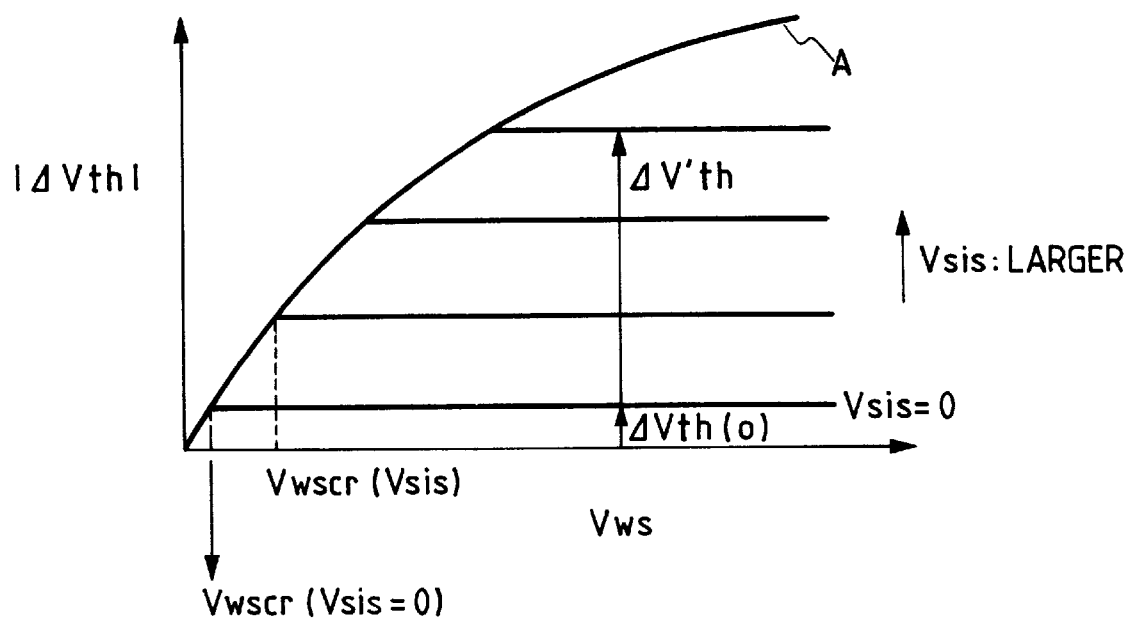
FIG. 11 is a graph showing the relationship between a well-source voltage $V_{WS}$ and a shift amount $\Delta V_{th}$ of a threshold value.

When this equation is expressed by a graph, a curve A in FIG. 11 is obtained. More specifically, as $V_{WS}$ (the potential of the well with respect to the source) increases, $|\Delta_{th}|$ increases. This is called a substrate bias effect.

The curve A applies in a case wherein a bulk MOS transistor is used. However, in a thin film transistor (TFT), since the thickness of the well is limited to a specific value, extension of a depletion layer is stopped when $V_{WS}$ reaches a certain value. For this reason, the substrate bias effect is relaxed. As the result of our vigorous study, it is obvious that a value $V_{WSCR}$ which is the value of $V_{WS}$ when the depletion layer extends by a length corresponding to the thickness of the well depends on the potential of the substrate silicon. When the relationship between $|\Delta V_{th}|$ and $V_{WS}$ is expressed by using a potential $V_{SiS}$ with respect to the source of the substrate silicon as a parameter, FIG. 11 is obtained. For example, when $V_{SiS}=0$, $|\Delta V_{th}|$ increases according to the curve A until $V_{WS}$ reaches a threshold value $V_{WSCr}$ ($V_{SiS}=0$). However, when $V_{WS}$ becomes larger than the threshold value $V_{WSCr}$ ($V_{SiS}=0$), $|\Delta V_{th}|$ is kept at a predetermined value. As $V_{SiS}$ increases, a threshold value $V_{WSCr}$ ($V_{SiS}$) at which $|\Delta V_{th}|$ is separated from the curve A increases.

In this manner, although the substrate bias effect is suppressed more effectively in the TFT than in the bulk MOSFET indicated by the curve A, the substrate bias effect operates in the TFT to shift the threshold value of the TFT.

Figure 12:
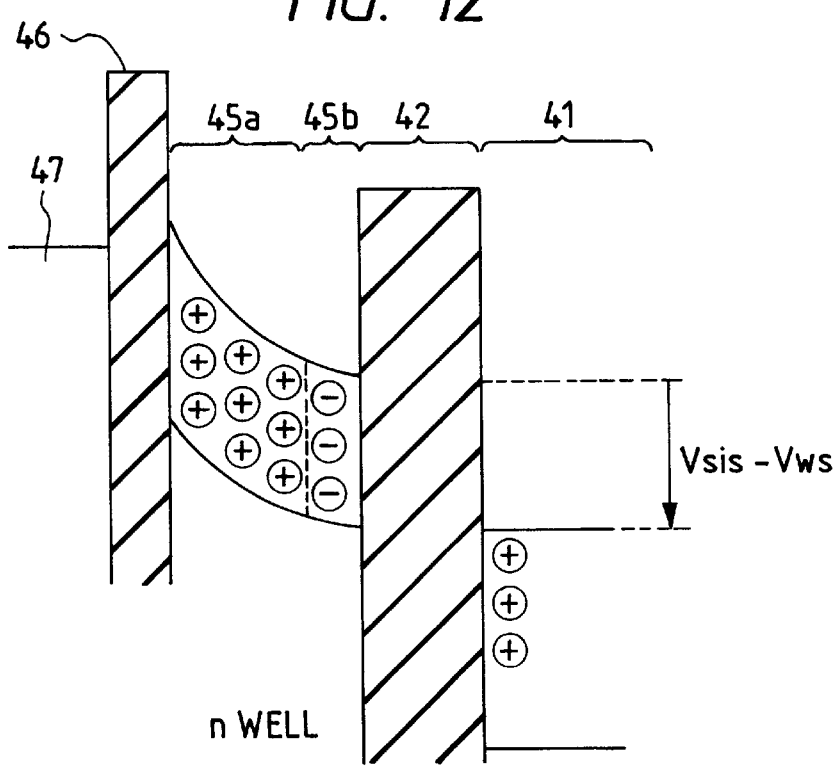
FIG. 12 is an energy band diagram showing the manner in which a neutral layer of an n well is generated by a potential between a substrate electrode and a gate electrode.

A model for theoretically explaining FIG. 11 can be considered in the following manner. FIG. 12 is an energy band diagram showing the manner in which a neutral layer of an n well is generated by a potential between the n well of the TFT and the substrate silicon. As shown in FIG. 12, a charge generated by the shift of the threshold value caused by $V_{SiS}$ is stored in the lower portion (45b) of the well by the potential difference between the substrate silicon and the well and a charge induced by the capacitor of the underlying insulating film, the charge Q is expressed by the following equation:

$$Q = C_{BOX}(V_{SiS} - V_{WS}) \tag{2}$$

($C_{BOX}$: capacitance of underlying oxide film per unit area)
In order to cancel the charge, a gate potential must be excessively applied through the gate insulating film. This voltage corresponds to the shift of the threshold value of the transistor when $V_{SiS}=0$ (V). More specifically, the following equation is established:

$$C_{ox}\Delta V_{th}' = Q = V_{BOX}(V_{SiS} - V_{WS})$$

$$\therefore \Delta V_{th}' = \frac{C_{BOX}}{C_{DX}}(V_{SiS} - V_{WS}) \tag{3}$$

Note that when $V_{WS}$ exceeds the threshold value $V_{WSCr}$ ($V_{SiS}$) at which $|\Delta V_{th}|$ is saturated for the first time, the well potential cannot be controlled, and the well potential is controlled by a line of electric force from the gate electrode. For this reason, $V_{WS}$ can be represented by $V_{WS}=V_{WSCr}$ ($V_{SiS}$). In addition, since $_{WSCr}$ ($V_{SiS}=0$) indicates a point at which the depletion layer has a thickness just equal to that of the well when $V_{SiS}=0$, $V_{WSCr}$ depends on a well concentration $N_W$ and the thickness $T_W$ of the well as follows:

$$V_{WSCr}(0) = 2\psi_F\{T_w^2(q^2N_w)/(4\epsilon_{Si}kTln(N_W/n_i))\} - 2\psi_F \tag{4}$$

When equation (1) is put in equation (4), $\Delta V_{th}$ ($V_{SiS}=0$) can be calculated. The total shift of the threshold value is expressed by the following equation:

$$\Delta V_{th} = \Delta V_{th}' = \Delta V_{th} \ (V_{SiS}=0)\text{tm} \tag{5}$$

For this reason, as is apparent from equations (3), (4), (5), the shift amount $\Delta V_{th}$ of the threshold value is a function of the well potential, the substrate silicon potential, and the thickness of the underlying oxide film through the medium of at least equation (3), and is a function of the thickness of the semiconductor thin film through the medium of equation (4).

More specifically, $\Delta V_{th}$ is in proportion to the substrate-source voltage and the well-source voltage (note that $\Delta V_{th}$ does not change when these voltages exceed a certain value) and the thickness of the semiconductor thin film, and is in inverse proportion to the thickness of the underlying oxide film. As a result, the threshold value of the MOS transistor increases.

Figure 1:
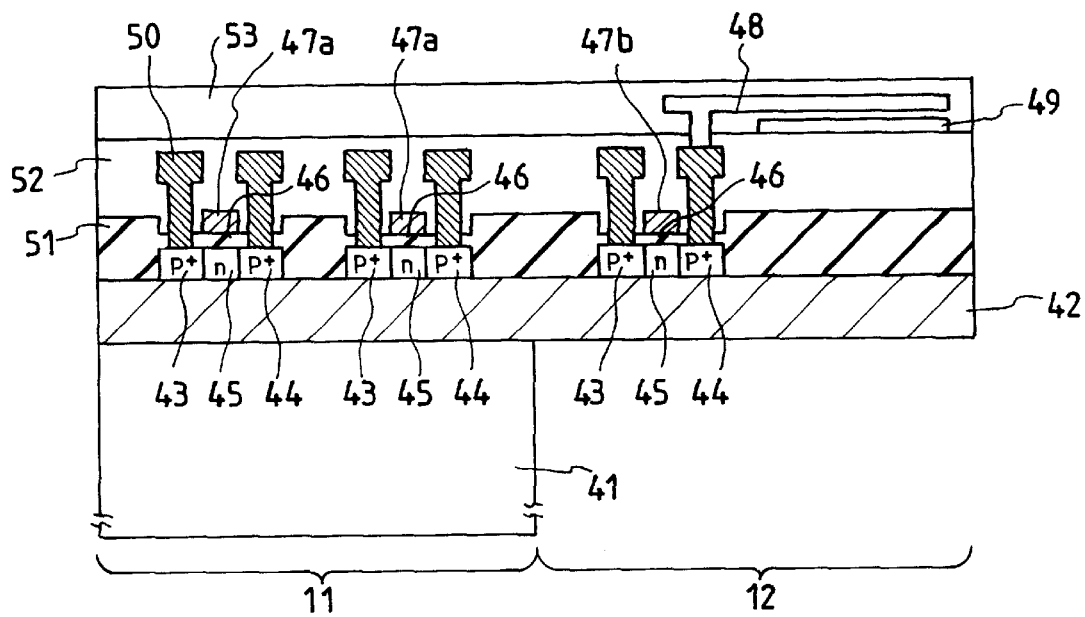
FIG. 1 is a sectional view showing a liquid crystal display apparatus according to Embodiment 1 of the present invention.

The present invention is obtained by the above consideration. A semiconductor integrated circuit according to the present invention will be described below with reference to the sectional view of a liquid crystal display apparatus which is a view for explaining Embodiment 1. Referring to FIG. 1, reference numeral 12 denotes an image display portion, and reference numeral 11 denotes a drive circuit portion around the image display portion. A substrate silicon immediately below the image display portion 12 is removed by hollowing out the image display portion 12. For this reason, the image display portion 12 becomes transparent. A substrate silicon 41 is left immediately below the drive circuit portion to keep the strength of the drive circuit portion and shield the drive circuit portion from light.

A TFT (Thin-Film-Transistor) for supplying a desired charge to a pixel is formed on an underlying insulating film 42, and is comprised of constituted by a source 43 and a drain 44 which are doped with a p-type dopant at a high concentration, a well 45 doped with an n-type dopant, a gate insulating film 46, a gate electrode 47B (to be referred to as a second gate electrode hereinafter to distinguish the gate electrode 47B from the gate electrode of the TFT in the drive portion). A pixel transparent electrode 48 for applying a voltage to a liquid crystal is connected to the drain 44, and the pixel transparent electrode 48 forms a holding capacity between the pixel transparent electrode 48 and a pixel common electrode 49 constituted by another transparent electrode layer.

The TFT in the peripheral drive circuit portion 11 is formed on the substrate silicon through the underlying insulating film. This TFT is comprised of a source 43 and a drain 44 which are doped with a p-type dopant at a high concentration, a well 45 doped with an n-type dopant, a gate insulating film 46, a gate electrode 47A (to be referred to as a first gate electrode hereinafter). A metal electrode 50 is properly connected to each TFT terminal to form a circuit. The elements are insulated from each other by a first insulating interlayer 51, and the metal electrodes are insulated from each other by a second insulating interlayer 52. A third insulating interlayer 53 serving as a protective film is formed on the surface of the TFT to insulate the TFT from other circuits.

As one parameter for obtaining the present invention, it is effective that the gate electrode 47A of the transfer transistor used for charge transfer and the gate electrode 47B of the TFT consist of materials having different work functions, respectively. For example, the gate electrode 47A is comprised of heavily doped p-type ($p^+$-type hereinafter) polysilicon, and the gate electrode 47B is comprised of heavily doped n-type ($n^+$-type hereinafter) polysilicon. Note that the $p^+$ type and $n^+$ type can be easily realized by changing a masking on the same polysilicon layer depending on the conductivity type of a dopant for ion injection. As the material of the gate electrode, a metal such as tungsten, molybdenum, or aluminum or an alloy thereof may also be used.

As a parameter used in the present invention, the impurity concentration of the MOS transistor may be used. In addition, the thickness of the thin film silicon layer of the SOI substrate may be used, too.

In the present invention, any MOS transistor on an oxide film, e.g., a MOS transistor used in an integrated circuit or a TFT (Thin-Film-Transistor) used in the pixel portion of a liquid crystal display apparatus may be used. In addition, the MOS transistor may be a p- or n-channel transistor or a transistor obtained by mixing the p- and n-channel transistors.

As an SOI (Silicon-on-Insulator) substrate, an SOI substrate obtained by an ordinary adhering method or an SIMOX method can be used as a matter of course.

In particular, in a liquid crystal display apparatus using a semiconductor integrated circuit according to the present invention, in consideration of a substrate bias effect, the thickness of an underlying oxide film, a well concentration, the thickness of a gate oxide film, and the work function of a gate electrode are preferably determined. At this time, (1) an effective threshold value $|V_{thTR}|$ of a transistor used for signal transfer satisfies the following condition:

$|V_{th}| \leq V_{DMIN}$ (minimum signal level)−$V_{margin}$, ($V_{margin} \approx 0.3$ to $0.8$ (V))

(2) When a threshold value $V_{th\_pixel}$ of a pixel TFT is selected to satisfy $V_{th\_pixel} \geq 1.5$ (V), the following object can be achieved.

As is apparent from the above description, "first potential" means the potential of a well for stabilizing the operation of a thin film transistor, and "second potential" means the potential of a semiconductor substrate for suppressing the operation of a parasitic transistor to stabilize the operation the thin film transistor.

Since the present invention surmounts the substrate bias effect, a transistor having no semiconductor substrate therebelow or a transistor having a semiconductor substrate therebelow can cause a MOS transistor having an oxide film as its underlying layer to have a threshold value at which data can be reliably transmitted. For this reason, an integrated circuit and a liquid crystal display apparatus which are free from an erroneous operation can be manufactured. Therefore, the semiconductor integrated circuit or liquid crystal display apparatus according to the present invention has the following additional effects.

(1) Since a signal voltage at the minimum level at which the signal voltage can be transferred can be lowered, the power supply voltage can be lowered as much as possible.

(2) Since the liquid crystal display apparatus can transfer a signal (e.g., a black signal) having a level which is close to the GND level within a desired period of time, the contrast of the liquid crystal can be improved.

(3) Since the liquid crystal display apparatus does not less a signal charge written in a pixel, the gradation characteristics of a liquid crystal display are improved.

(Embodiment 1)

According to Embodiment 1, in a liquid crystal display apparatus, the gate electrode of a transfer transistor used for charge transfer and the gate electrode of a TFT consist of materials having different work functions, respectively. FIG. 1 is a sectional view showing a TFT substrate on which the peripheral drive circuit and pixel TFT of an active matrix liquid crystal display apparatus according to Embodiment 1 are mounted.

The manufacturing procedures of the liquid crystal display apparatus according to the present invention will be briefly described below. As the TFT substrate, an SOI (Silicon-on-Insulator) substrate is formed by the following method. That is, a first substrate having an epitaxial layer grown on a porous silicon is adhered to a second silicon substrate having an oxide surface, and the first silicon substrate and porous silicon are removed by etching. As a matter of course, as an SOI substrate, a substrate formed by an adhering method or an SIMOX method may be used.

A transfer transistor and a pixel TFT which occupy most of a peripheral drive circuit were manufactured in the thin film silicon portion of the SOI substrate. A transparent electrode film was formed. As a method of manufacturing the transfer transistor and TFT and a method of forming the transparent electrode film and so forth, the sufficiently established, known methods were used. When the substrate silicon immediately below an image display portion 12 was hollowed out, 22-wt % TMAH (tetramethyl ammonium hydroxide) was used at 90° C. For this reason, the image display portion became transparent. Immediately below the drive circuit portion, a substrate silicon 41 was left to keep the strength of the drive circuit portion and shield the drive circuit portion from light.

Referring to FIG. 1, reference numeral 12 denotes an image display portion and reference numeral 11 denotes a peripheral drive circuit portion around the image display portion. A substrate silicon is removed by hollowing out the image display portion 12. The substrate silicon 41 is left immediately below the drive circuit portion to keep the strength of the drive circuit portion and shield the drive circuit portion from light.

The TFT in the peripheral drive circuit portion 11 is formed on the substrate silicon through an underlying insulating film. This TFT is comprised of a source 43 and a drain 44 which are doped with a p-type dopant at a high concentration, a well 45 doped with an n-type dopant, a gate insulating film 46, and a gate electrode 47A (to be referred to as a first gate electrode hereinafter). A metal electrode 50 is properly connected to each TFT terminal to form a circuit. The elements are insulated from each other by a first insulating interlayer 51, and the metal electrodes are insulated from each other by a second insulating interlayer 52. A third insulating interlayer 53 serving as a protective film is formed on the surface of the TFT to insulate the TFT from other circuits. In this embodiment, the impurity concentration of the n well is $1\times10^{16}$ cm$^{-3}$, and the thickness of the gate insulating film is 1,000 Å. However, the impurity concentration and the thickness are not limited to these values.

A gate electrode is to be manufactured. The gate electrode 47A consists of heavily doped p-type polysilicon, and a gate electrode 47B consists of heavily doped n-type polysilicon. In this manner, at the absence of a substrate bias effect, the threshold value of the transfer transistor can be set to be –1.0 (V), and the threshold value of the TFT can be set to be –2.0 (V).

When both the potentials of the n well 45 and the substrate silicon are fixed to +16 V, and a potential which is close to the GND level is transferred, the threshold value of the transistor effectively increases by the substrate bias effect described above. In consideration of this, the thickness of the underlying insulating layer is set to be 8,000 Å, and the effective threshold value of the transistor is set to be –2.5 (V). However, the effective threshold value is set at a level at which a black signal of 3 (V) can be transferred without any problem. On the other hand, in the pixel TFT, a floating phenomenon in the n well 45 occurs, and the threshold value changes due to the operation of the TFT. However, the threshold value having the minimum absolute value is about –1.5 (V). Even if current leakage in a Sub-threshold region is considered, a problem about leakage of the pixel TFT is not posed.

(Embodiment 2)

Although embodiment 2 describes an active matrix liquid crystal display apparatus as in Embodiment 1, in order to satisfy the conditions of the present invention, the gate electrodes (47) of the transfer transistor and pixel TFT of a peripheral drive circuit were comprised of a single p$^+$-type polysilicon, and only the concentration of the n$^+$-type dopant in the well surface of the pixel TFT was increased. The other arrangements of Embodiment 2 are the same as those of Embodiment 1.

Figure 2:
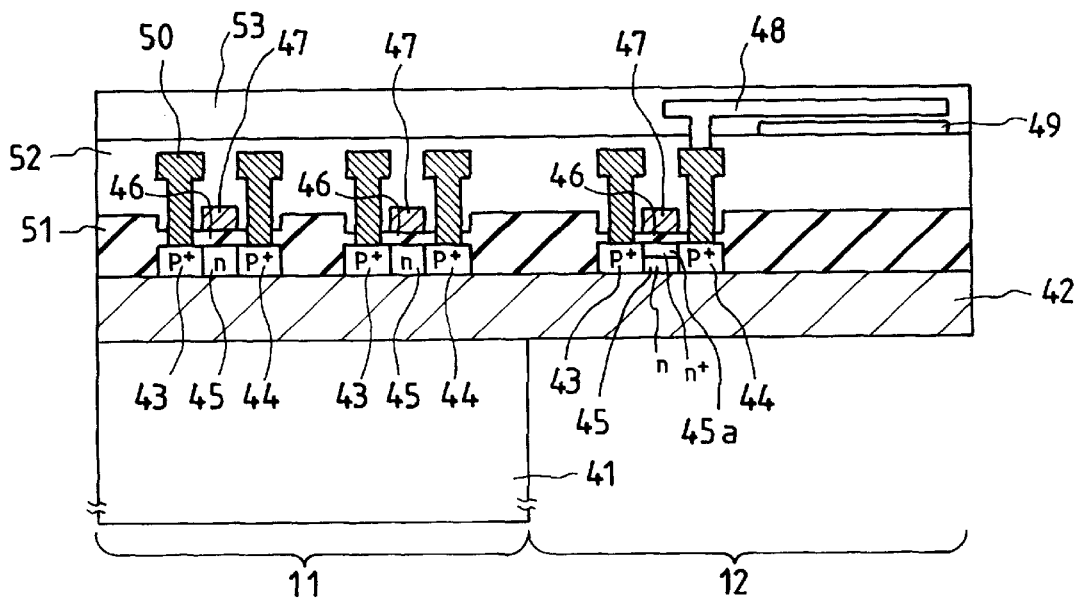
FIG. 2 is a sectional view showing a liquid crystal display apparatus according to Embodiment 2 of the present invention.

FIG. 2 is a sectional view showing a TFT substrate in this liquid crystal display apparatus. The concentrations of the n wells (45) of both the transistors were set to be $1.0\times10^{16}$ cm$^{-3}$, and the thicknesses of the gate insulating films were set to be 1,000 Å, and the threshold value of the TFT in the peripheral drive circuit portion was set to be –1.0 (V). In the pixel TFT, phosphorous ions were implanted into the surface of the TFT at a dose of $1.0\times10^{12}$ (cm$^{-2}$) in the step before formation of the gate electrode to form an n$^+$-type region (45a) immediately below the gate insulating film 46. The threshold voltage of the pixel TFT was set to be –1.5 (V).

As a result, when the thickness of the underlying oxide film was set to be 8,000 Å, and the potentials of the n well and substrate silicon were set to be +16 (V), the effective threshold voltage of the transfer transistor of the peripheral drive circuit became –2.5 (V), and a black signal could be satisfactorily written. Note that ion implantation for adjusting the threshold voltage was performed to the pixel TFT in this embodiment. However, according to the above point of view, the same effect as described above can be obtained by the following structures (a) and (b) or other structures.

(a) Boron ions are implanted into the n well of the peripheral drive circuit portion to make the n well of the transfer transistor of the peripheral drive circuit a semiconductor which is almost an intrinsic semiconductor.

(b) Boron ions are implanted into the n well of the peripheral drive circuit portion, and phosphorous ions are implanted into the well of the pixel TFT.

Note that, if the thickness of the n well is set to be about 5,000 Å or less, a depletion layer obtained when the TFT is in an ON state almost reaches the underlying insulating film. Therefore, ions for adjusting the threshold value need not be present in the uppermost surface of the n well, and the same effect as described above can be obtained when the ions are uniformly diffused in the n well (Embodiment 3)

Embodiment 3 describes an active matrix liquid crystal display apparatus. In order to make the threshold values of a substrate silicon removed portion (pixel TFT portion) and non-removed portion (peripheral drive circuit portion different from each other, the gate electrode (47) of the transfer transistor of a peripheral drive circuit and the gate electrode (47) of a pixel TFT are comprised of single p$^+$-type polysilicon, the thickness of the thin film silicon region on an underlying insulating film 42 is set to be small in the silicon removed portion, and is set to be large in the non-removed portion.

Figure 3:
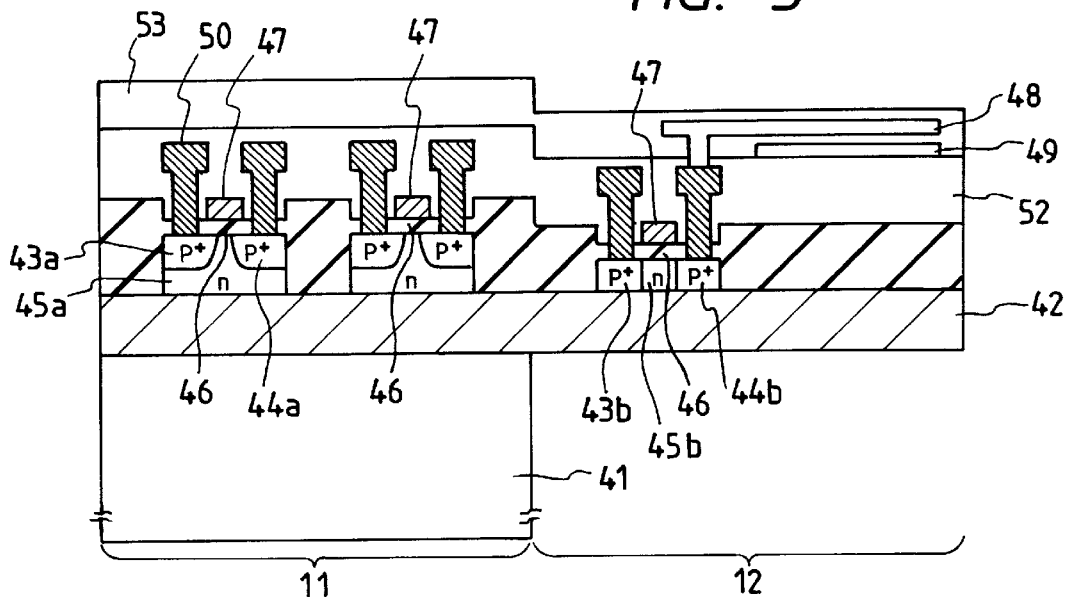
FIG. 3 is a sectional view showing a liquid crystal display apparatus according to Embodiment 3 of the present invention.

FIG. 3 is a sectional view showing a TFT substrate in the active matrix liquid crystal display apparatus according to Embodiment 3. In this embodiment, the following phenomenon is used. That is, ion implantation is performed to the entire surface of the TFT substrate at equal doses, and annealing is performed, so that impurity regions having thicknesses which are respectively almost proportional to the thicknesses of the thin silicon films are formed.

For example, the thickness of a silicon (45a) of the substrate silicon non-removed portion (11) is set to be 8,000 Å, and the thickness of a silicon (45b) of the removed portion (12) is set to be 4,000 Å. When the concentration of the n well of the removed portion is set to be $1.0\times10^{16}$ cm$^{-3}$ the concentration of the non-removed portion becomes $5\times10^{15}$ cm$^{-3}$. The thickness of the gate oxide film is set to be 1,000 Å, and the polysilicon gate is of n$^+$-type, so that the threshold voltages of the non-removed (transfer transistor) and the removed portion (pixel TFT) are set to be –1.2 (V) and –1.7 (V), respectively.

Referring to FIG. 3, the drain (43a) and source (44a) of the transfer transistor of the non-removed portion do not reach the underlying oxide film. However, when the thicknesses of the thin silicon films of the portions are set, the relationship between the junction depths of the source and the drain and the position of the underlying oxide film can be variously set as a matter of course.

In addition, when the thickness of the silicon film of the non-removed portion decreases, the speed of the transistor in the drive circuit can be made high. For example, when the thickness of the thin film silicon of the peripheral drive circuit portion serving as the non-removed portion is set to be 2,000 Å or less, and the well concentration is set to be $1.0 \times 10^{15}$ cm$^{-3}$, a fully depleted TFT structure can be obtained. When the TFT is fully depleted, the absolute value $|V_{th}|$ of the threshold value decreases. For this reason, the gate electrode was of n$^+$-type, and the threshold value became −0.8 (V). In the TFT of the pixel portion, the silicon thickness was set to be 5,000 Å, and the well concentration was set to be $1.0 \times 10^{16}$ cm$^{-3}$, so that the threshold voltage is suppressed to −2.0 (V). In addition, the full depletion operation could improve the switching speed of the transistor by 20% and could reduce the entire area of the drive circuit by 20%. Therefore, it is successful that the yield of liquid crystal display apparatuses can be increased.

In Embodiments 1 to 3, although specific impurity concentrations, film thicknesses, and materials are used, an infinite number of combinations of impurity concentrations, film thicknesses, and materials can be used as a matter of course without departing from the object and function of the present invention.

(Embodiment 4)

Figure 4A:
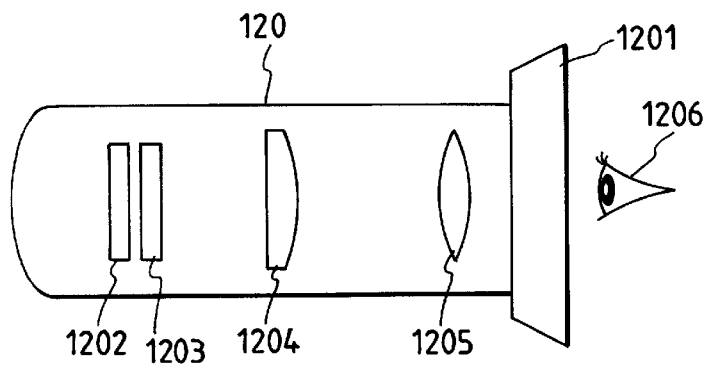
FIGS. 4A and 4B are views illustrating a view finder according to Embodiment 4 of the present invention.
Figure 4B:
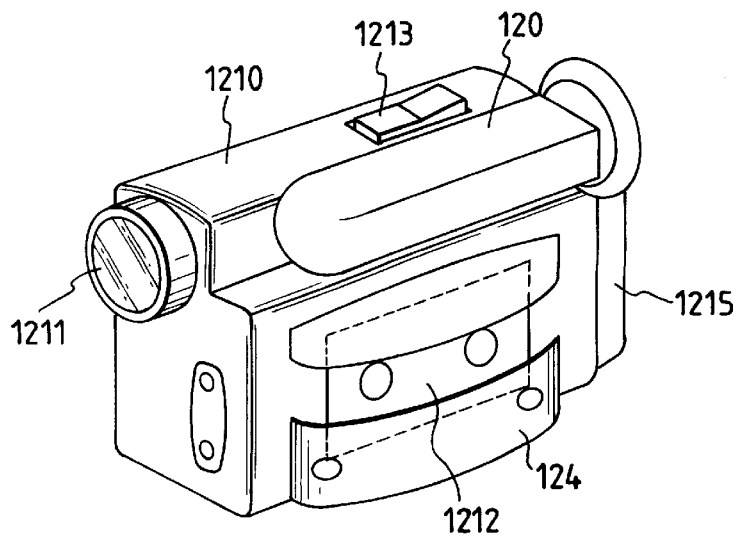

Embodiment 4 describes an application wherein the liquid crystal display apparatus described in Embodiments 1 to 3 is used as a view finder. FIG. 4A is a sectional view showing a video camera using this view finder, and FIG. 4B is the sketch diagram of the video camera. A main body 1210 is mainly comprised of by an image-pickup section 1211, a recording section 1212, and a finder section 120. A photographer records an image incident from an image pickup lens on the recording section with viewing a photographed image from the finder. Reference numeral 1213 denotes a zooming switch. The image pickup lens is driven to change a recorded image in size. The recording section uses, for example, a magnetic recording tape as a recording medium. Reference numeral 1214 denotes an auxiliary part, for holding a hand of the photographer, which is a band comprised of a leather or cloth material. As a power supply for the whole apparatus, a rechargeable battery 1215 is incorporated in the apparatus. Giving attention to FIG. 4A which is the sectional view of the finder section, a surface light source 1202 is arranged on the left of the liquid crystal display panel 1203 to send a display image on the liquid crystal display panel 1203, through a magnifying lens 1204, to an eye-ball 1206 of the photographer which is in contact with an eye cup 1201. Reference numeral 1205 denotes a diopter adjusting lens which can be moved forward/backward according to the visual acuity of the photographer to eliminate the blurring of the image. In this embodiment, 300,000 pixels are arranged on a 0.7-inch color liquid crystal display panel. Therefore, a contrast of 100:1 and 64 gradations which cannot be easily realized by a conventional technique are realized, and the present invention contributes to high value-adding of a video camera.

(Embodiment 5)

Figure 5A:
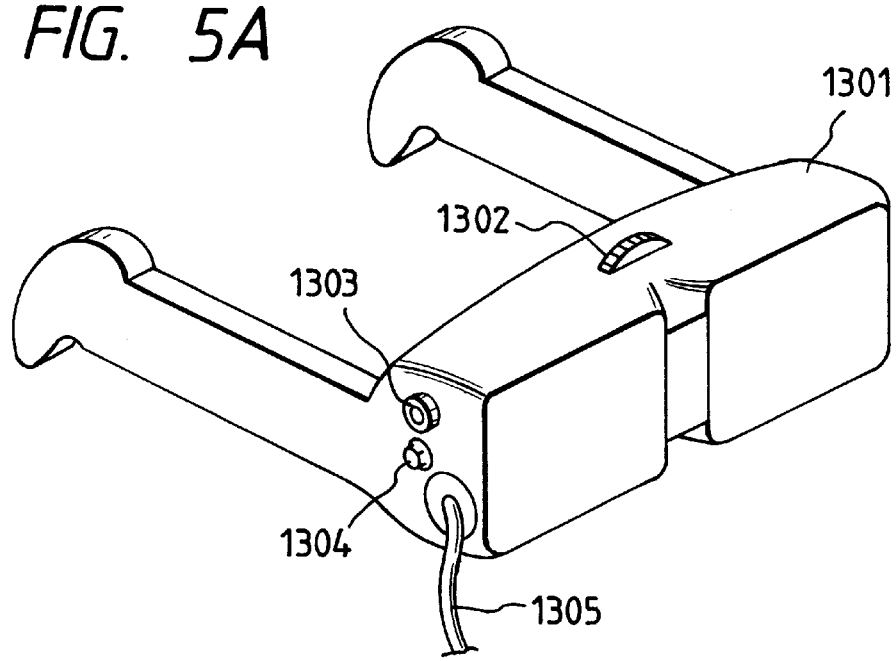
FIGS. 5A and 5B are views illustrating a head mount display according to Embodiment 5 of the present invention.
Figure 5B:
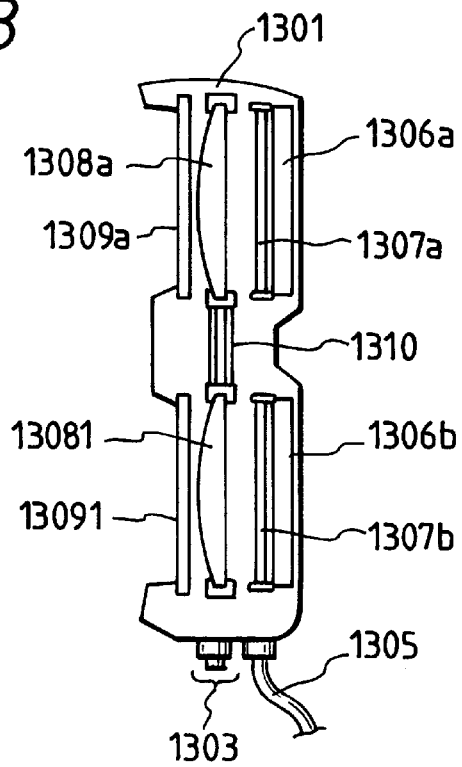

Embodiment 5 describes an application wherein the liquid crystal display apparatus described in Embodiments 1 to 3 is applied to an HMD (Head Mount Display). FIG. 5A is the sketch diagram of the HMD, and FIG. 5B is a sectional view showing the HMD when viewing from the upper surface of the HMD. A main body 1301 is of a spectacle type and has two liquid crystal panels which are respectively arranged at the positions corresponding to both the eyes. The portions to be in contact with ears have hook-like shapes, and a diopter adjusting dial 1302 is arranged on the upper portion of the main body. Reference numeral 1303 denotes a power supply switch for turning on/off a power supplied from a power supply cord 1305. Reference numeral 1304 denotes a diopter adjusting knob. The plan view of the inside of the main body is shown in FIG. 5B. In the structure corresponding to the left eye, a liquid crystal display panel 1307a is arranged in the front of a backlight source 1306a, a magnifying/diopter adjusting lens 1308a is arranged in the front of the liquid crystal display panel 1307a, and a protective glass 1309a is arranged as the most front surface. The portion corresponding to the right eye has the same structure as that of the portion corresponding to the left eye. A drive mechanism is connected to the lenses 1308a and 1308b, and move forward/backward by the dial 1302. The same image may be displayed on the left and right liquid crystal display panels. When images whose visions are intentionally shifted from each other are displayed on the left and right liquid crystal display panels, respectively, a binocular vision can be obtained. For this reason, VR (Virtual Reality) and the feeling of being at a live performance of a TV game set or the like can be improved. These video signals, a power for driving the panels, and a power for the backlights 1306a and 1306b can be supplied from the power supply cord 1305. Although each liquid crystal panel properly has a size of 0.4 to 1.0 inch, 0.7-inch liquid crystal panel was used in this case. The number of pixels is set to be 500,000, and a color display having 64 gradations, 200-million colors, a contrast of 100:1 could be obtained. According to this system, an HMD whose contrast is not degraded even if a high-definition image is displayed could be realized. The system considerably contributed to miniaturization of an apparatus and to an improvement of the feeling of being at a live performance.

(Embodiment 6)

Figure 6A:
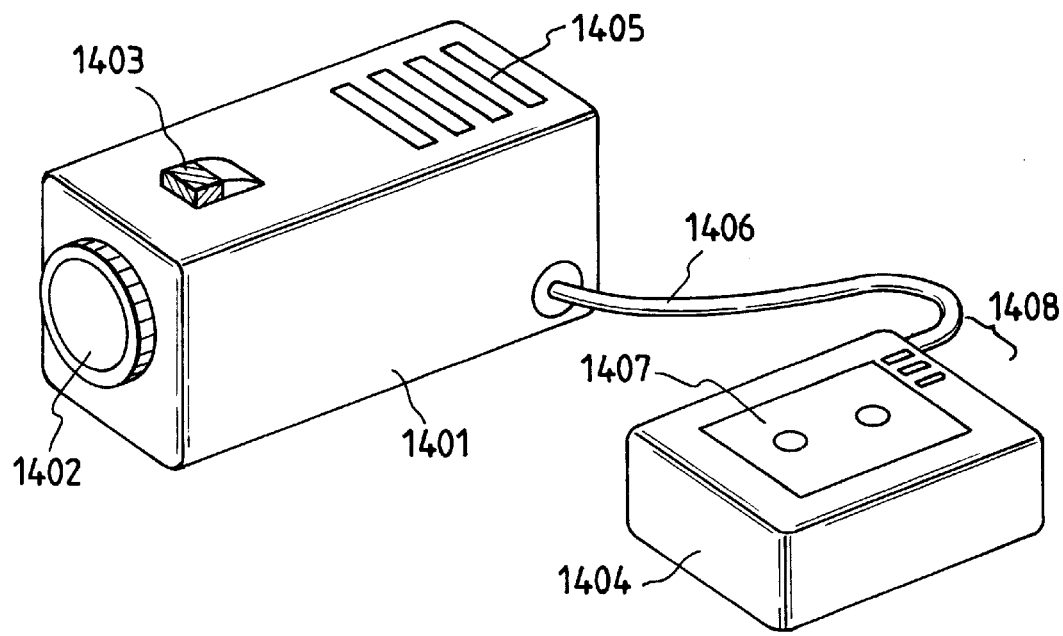
FIGS. 6A and 6B are views illustrating a liquid crystal projector according to Embodiment 6 of the present invention.
Figure 6B:
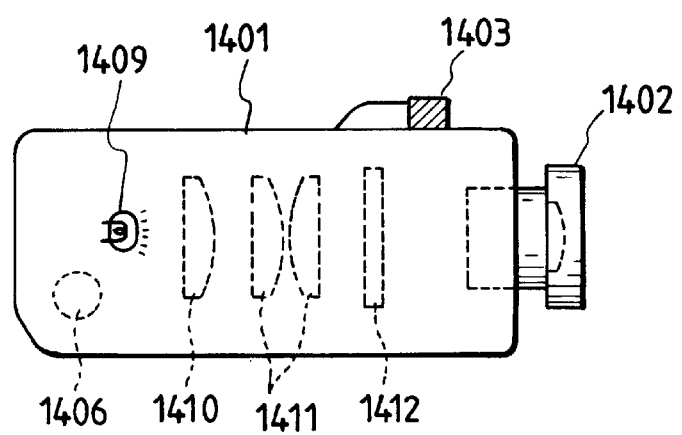

Embodiment 6 describes an application wherein the liquid crystal display apparatus described in Embodiments 1 to 3 is applied as a liquid crystal projector. FIG. 6A is the sketch diagram of the liquid crystal projector, and FIG. 6B is a sectional view showing the liquid crystal projector when viewed from the upper surface of the liquid crystal projector.

The main body is comprised of by a lens housing 1401, a projection lens 1402, an optical-system speaker 1403, and an image reproducing section 1404. The housing has a cooling air hole 1405, and the main body and the reproducing section are connected to each other by a connector 1406. The reproducing section comprises a recording medium storage section 1407 and control switches 1408. Giving attention to the optical system in the housing in FIG. 6B, an image on the liquid crystal display is displayed on the back of a liquid crystal display panel 1412 through a magnifying lens 1411 and a condenser lens 1402.

A liquid crystal display panel having a size of 0.7 to 5.0 inches and 300,000 or more pixels is effectively used. The present inventor designed a display member having a 2-inch panel size and one million pixels, obtained a contrast of 100:1 or more, and succeeded in manufacturing a prototype of a high-grade liquid crystal projector.

What is claimed is:

1. A method for translating image signals between a source region and a drain region of a transistor through a well region, using a liquid crystal device, the liquid crystal device comprising of a semiconductor substrate, an insulating layer arranged on the semiconductor substrate, a plurality of pixel switching devices on the insulating layer, a pixel electrode connected to each of the plurality of the pixel switching devices, and a translation switching device for providing an image signal to the pixel switching device; wherein the translation switching device is composed of a field effect transistor formed on the insulating layer overlaying the semiconductor substrate and the pixel switching device is composed of a field effect transistor formed on the insulating layer, the semiconductor substrate under which is removed, the field effect transistor having a source and drain region, the source and drain regions comprising a first conduction type semiconductor, the well region comprising a second conduction type semiconductor and being arranged between the source and drain regions of the field effect transistor, an ion dopant concentration of the well of the field effect transistor composing the translation switching device being greater than an ion dopant concentration of the well of the field effect transistor composing the pixel switching device, said method comprising the step of:

translating signals under a condition such that a threshold voltage of the transistor has been altered by applying a first voltage to the well region and a second voltage to the semiconductor substrate so as to satisfy one of the following conditions (a) and (b):

(a) wherein the well region is comprised of a p-type semiconductor, and $V_{DMIN} > V_{SS} + V_{th} + \Delta V_{th}$, wherein $V_{DMIN}$ is a minimum voltage of the image signals, $V_{SS}$ is a minimum voltage in the semiconductor circuit and the second voltage applied to the semiconductor substrate, $V_{th}$ is a threshold voltage of the transistor in a state of not applying a voltage to both of the semiconductor substrate and the well region, $\Delta V_{th}$ is a change amount of the threshold voltage of the transistor caused by applying the first voltage to the well region and the second voltage to the semiconductor substrate, respectively; and (b) wherein the well region is comprised of an n-type semiconductor, and $V_{DMAX} < V_{DD} + V_{th} + \Delta V_{th}$, wherein $V_{DMAX}$ is a maximum voltage of the image signals, $V_{DD}$ is a maximum voltage in the semiconductor circuit and the second voltage applied to the semiconductor substrate, $V_{th}$ is a threshold voltage of the transistor in a state of not applying a voltage to both of the semiconductor substrate and the well region, $\Delta V_{th}$ is a change amount of the threshold voltage of the transistor caused by applying the first voltage to the well region and the second voltage to the semiconductor substrate, respectively.

2. The method for translating image signals according to claim 1, wherein a hollow cavity is formed in the semiconductor substrate below the displaying region on which the pixel switching devices are located.

3. The method for translating image signals according to claim 2, wherein the following condition is satisfied: $1.5 (V) < |V_{thpixel}|$, and $|V_{thTR}| < V_{thpixel}$, where $V_{thpixel}$ is a threshold value of a transistor forming the pixel switching device, and $V_{thTR}$ is a threshold value of a transistor forming the translation switching device.

4. The method for translating image signals according to claim 1, wherein the translation switching device is composed of only a P-MOS transistor consisting of heavily doped p-type polysilicon, and the pixel switching is composed of only a P-MOS transistor, the gate electrode of the P-MOS transistor of the pixel switching device consisting of heavily doped n-type polysilicon.

* * * * *

UNITED STATES PATENT AND TRADEMARK OFFICE
CERTIFICATE OF CORRECTION

PATENT NO. : 6,191,435 B1
APPLICATION NO. : 08/612496
DATED : February 20, 2001
INVENTOR(S) : Shunsuke Inoue It is certified that error appears in the above-identified patent and that said Letters Patent is hereby corrected as shown below:

ON THE TITLE PAGE:

(54) In the TITLE:

"APPRATUS" should read --APPARATUS--; and

(57) In the ABSTRACT:

Line 16, "such" should read --in such--.

COLUMN 1:

Line 2, "APPRATUS" should read --APPARATUS--.

COLUMN 2:

Line 26, "canses" should read --causes--;
Line 28, "are" should read --and are--; and
Line 35, "a b→c→..." should read --a→b→c→...--.

COLUMN 4:

Line 62, "such" should read --in such--; and
Line 65, "such" should read --in such--.

COLUMN 5:

Line 6, "reason." should read --reason:--;
Line 10, "which" should be deleted;
Line 29, "equation." should read --equation:--; and
Line 48, "$|\Delta_{th}|$" should read --$|\Delta V_{th}|$--.

COLUMN 6:

Line 30, "$\therefore \Delta V^1_{th} =$" should read --$\therefore \Delta V_{th}^1 =$--;
Line 44, "$(N_w/n_i))$" should read --$(N_w/n_i)$--; and
Line 50, "$\Delta V_{th} = \Delta V_{th}' = \Delta V_{th}$" should read --"$\Delta V_{th} = \Delta V_{th}' + \Delta V_{th}$--.

UNITED STATES PATENT AND TRADEMARK OFFICE
CERTIFICATE OF CORRECTION

PATENT NO. : 6,191,435 B1
APPLICATION NO. : 08/612496
DATED : February 20, 2001
INVENTOR(S) : Shunsuke Inoue It is certified that error appears in the above-identified patent and that said Letters Patent is hereby corrected as shown below:

COLUMN 10:

Line 41, "portion dif-" should read --portion) dif- --; and
Line 61, "$1.0\times10^{16}cm^{-3}$" should read --$1.0\times10^{16}cm^{-3}$,--.

COLUMN 11:

Line 38, "by" should be deleted.

COLUMN 12:

Line 58, "1402." should read --1410.--.

COLUMN 13:

Line 18, "an ion dopant concentration of the well of the field effect transistor composing the translation switching device being greater than an ion dopant concentration of the well of the field effect transistor composing" should read --both the translation switching device and the pixel switching device being composed of a MOS transistor, and a conductive type of polysilicon used for the gate electrode of the translation switching device being different from a conductive type of polysilicon used for the gate electrode of--

Signed and Sealed this

Twenty-second Day of January, 2008

JON W. DUDAS
*Director of the United States Patent and Trademark Office*